(12) United States Patent
Petenyi et al.

(10) Patent No.: US 12,413,221 B2
(45) Date of Patent: Sep. 9, 2025

(54) SOA PROTECTION OF A POWER TRANSISTOR

(71) Applicant: STMicroelectronics International N.V., Geneva (CH)

(72) Inventors: Sandor Petenyi, Lysa nad Labem (CZ); Lukas Buryanec, Trutnov (CZ)

(73) Assignee: STMicroelectronics International N.V., Geneva (CH)

( * ) Notice: Subject to any disclaimer, the term of this patent is extended or adjusted under 35 U.S.C. 154(b) by 139 days.

(21) Appl. No.: 18/240,585

(22) Filed: Aug. 31, 2023

(65) Prior Publication Data

US 2025/0080100 A1   Mar. 6, 2025

(51) Int. Cl.
 *H03K 17/082* (2006.01)
 *H03K 5/24* (2006.01)

(52) U.S. Cl.
 CPC .............. *H03K 17/082* (2013.01); *H03K 5/24* (2013.01)

(58) Field of Classification Search
 CPC ........................................ H03K 17/082–0828
 See application file for complete search history.

(56) References Cited

U.S. PATENT DOCUMENTS

| | | | |
|---|---|---|---|
| 8,299,767 B1 * | 10/2012 | Tuozzolo | H02H 3/42 323/275 |
| 10,910,827 B2 * | 2/2021 | Valdivia Guerrero | H03K 17/166 |
| 11,870,428 B1 * | 1/2024 | Cox | G01R 19/165 |
| 2008/0061752 A1 | 3/2008 | Heath | |
| 2015/0357904 A1 | 12/2015 | Odell et al. | |
| 2017/0126222 A1 | 5/2017 | O'Sullivan et al. | |
| 2021/0288638 A1 * | 9/2021 | Filoramo | H03K 17/08122 |
| 2022/0285927 A1 | 9/2022 | Bacigalupo et al. | |
| 2023/0065659 A1 | 3/2023 | Venkatraman | |
| 2024/0072530 A1 * | 2/2024 | Forejtek | H02H 9/041 |

* cited by examiner

*Primary Examiner* — Jared Fureman
*Assistant Examiner* — Christopher J Clark
(74) *Attorney, Agent, or Firm* — Crowe & Dunlevy LLC

(57) ABSTRACT

A power circuit includes a power transistor coupled between input and output nodes and receiving a control signal. A current sensing current senses a power current provided by the power transistor to the output node and generates a sense voltage. A voltage sensing circuit senses a drain-to-source voltage of the power transistor and generates a VDS sense current. A safe operating area (SOA) shaping circuit has a gain set by an adjustable resistance that is dynamically adjusted based upon the VDS sense current, the SOA shaping circuit applying the gain to the sense voltage to produce an adjusted sense voltage. A timing circuit generates an intermediate voltage by comparing the adjusted sense voltage and a first reference. An output comparator asserts a flag in response to the intermediate voltage becoming at least equal to a second reference. The control signal is modified in response to assertion of the flag.

16 Claims, 8 Drawing Sheets

SOA PROTECTION OF A POWER TRANSISTOR

TECHNICAL FIELD

This disclosure is directed to the field of analog power electronic circuits and, in particular, to a technique for protection of a power transistor against operating outside of its safe operating area (SOA).

BACKGROUND

Power transistors play a role in a variety of electronic devices and systems, and their safe operation is of particular interest. A characteristic defining the operating limits of power transistors is the Safe Operating Area (SOA), which delineates the maximum power dissipation that a power transistor can endure without experiencing damage.

Inherently, power transistors are not self-protecting components, which leaves them susceptible to overload. Such overloads can arise due to various conditions, such as short circuits, voltage spikes, or excessive power dissipation. Therefore, to prevent the destructive effects of these overloads, protection circuits employ sensors to continuously monitor the operating parameters of the transistor. If the monitored parameters suggest that the transistor is operating outside of its SOA, the protection circuits take action prevent potential damage. The monitored parameters may include overcurrent and overvoltage conditions, as well as thermal conditions.

However, a challenge arises in that the SOA is not defined by a linear relationship between the drain current (ID) and the drain to source voltage (VDS), as can be seen in FIG. 1. This non-linearity complicates the design of protection circuits, creating challenges to ensuring that the power transistor operates within its SOA, while also maximizing the conduction of drain current ID for a given drain to source voltage VDS.

Known designs struggle with these complexities and have limitations regarding the handling of high voltages, may occupy a large physical footprint, and lack flexibility-meaning they need to be precisely matched to the specific power transistor they protect.

In certain power electronics applications, such as power supplies, motor drives, and power amplifiers, where power transistors handle high currents and voltages, the ability to accurately monitor and control the operation within the SOA becomes of particular interest. This is not only to prevent component failure but also to provide for reliability.

Therefore, there is a need for a protection circuit that addresses these issues-one that can handle high voltages, is compact, provides flexibility, and is easy to program for different applications, thereby overcoming the drawbacks of conventional designs.

SUMMARY

Disclosed herein is a power circuit, including: a power transistor coupled between an input node and an output node, the power transistor receiving a control signal from a controller; a current sensing current configured to sense a power current provided by the power transistor to the output node and generate a sense voltage based thereupon; a voltage sensing circuit configured to sense a drain to source voltage of the power transistor and generate a VDS sense current based thereupon; a safe operating area (SOA) shaping circuit having a gain set by an adjustable resistance, the adjustable resistance being dynamically adjusted based upon the VDS sense current, the SOA shaping circuit configured to apply the gain to the sense voltage to produce an adjusted sense voltage; a timing circuit configured to generate an intermediate voltage based upon a comparison between the adjusted sense voltage and a first reference; and an output comparator configured to assert a flag in response to the intermediate voltage becoming at least equal to a second reference. The controller is configured to modify the control signal in response to assertion of the flag.

The current sensing circuit may include: a replica transistor coupled between the input node and the output node, the replica transistor receiving the control signal from the controller; wherein the replica transistor has a same width to length ratio as the power transistor but is smaller in size, thereby generating a replica current that is representative of, but lesser in magnitude than, the power current; and a sensor configured to generate a sense current based upon the replica current, with the sense voltage being generated based upon the sense current flowing through a sense resistor.

The voltage sensing circuit may include: a first sense transistor having a first conduction terminal coupled to the input node through a VDS sense resistor, a second conduction terminal coupled to a first node, and a control terminal coupled to the output node; and a current mirror having an input connected to the first node and an output connected to a second node.

The SOA shaping circuit may include: an amplifier having a non-inverting input coupled to receive the sense voltage and an inverting input coupled to an output of the amplifier through a feedback resistor; and the adjustable resistance coupled between the inverting input of the amplifier and ground.

The adjustable resistance may be coupled to an input node of the SOA shaping circuit. The adjustable resistance may include: a mirroring circuit configured to mirror the VDS sense current to thereby generate a plurality of differently scaled mirrored currents; a plurality of current comparators each configured to compare a respective one of the plurality of different scaled mirrored currents to a corresponding one of a plurality of reference currents and to produce a comparison voltage at a respective comparison node based thereupon; and a plurality of resistors each coupled between a corresponding one of the comparison nodes and the input node of the SOA shaping circuit.

Each of the plurality of current comparators may include: a current mirror having an input coupled to receive the corresponding one of the plurality of reference currents and an output coupled to the respective comparison node; and a transistor arrangement coupled to a corresponding one of the plurality of resistors, control of the transistor being based upon the comparison voltage at the respective comparison node.

The transistor arrangement may include a current mirror having an input coupled to the respective comparison node and an output coupled to the corresponding one of the resistors.

The transistor arrangement may include an output transistor having a first conduction terminal coupled to the corresponding one of the resistors, a second conduction terminal coupled to ground, and a control terminal coupled to receive the comparison voltage.

The transistor arrangement may further include an additional transistor having a first conduction terminal left floating, a second conduction terminal coupled to ground, and a control terminal coupled to receive the comparison voltage.

The first and second references may be equal.

Also disclosed herein is a method of protecting a power transistor. The method includes: continuously sensing a drain to source voltage of the power transistor; sensing a current flowing through the power transistor; generating an adjusted voltage from the sensed current based on the continuously sensed drain to source voltage; comparing the adjusted voltage with a first reference voltage to produce a comparison value; accumulating the comparison value over time to produce an accumulated voltage; comparing the accumulated voltage with a second reference voltage; and triggering a protection mechanism when the accumulated voltage reaches the second reference voltage.

The generating of the adjusted voltage may include amplifying the sensed current by a gain determined based upon an adjustable resistance, wherein the adjustable resistance is adjusted based on the continuously sensed drain to source voltage.

The adjustable resistance may be continuously adjusted based on the continuously sensed drain to source voltage.

The adjustable resistance may be adjusted in a piecewise fashion based on the continuously sensed drain to source voltage.

Sensing the current flowing through the power transistor may include: generating a scaled replica of the current flowing through the power transistor using a replica transistor that is a scaled replica of the power transistor, and generating the sensed current from the scaled replica of the current flowing through the power transistor.

Sensing the current flowing through the power transistor may also include generating a sense voltage from the sensed current; and wherein generating the adjusted voltage comprises adjusting the sense voltage to produce the adjusted voltage.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 1:
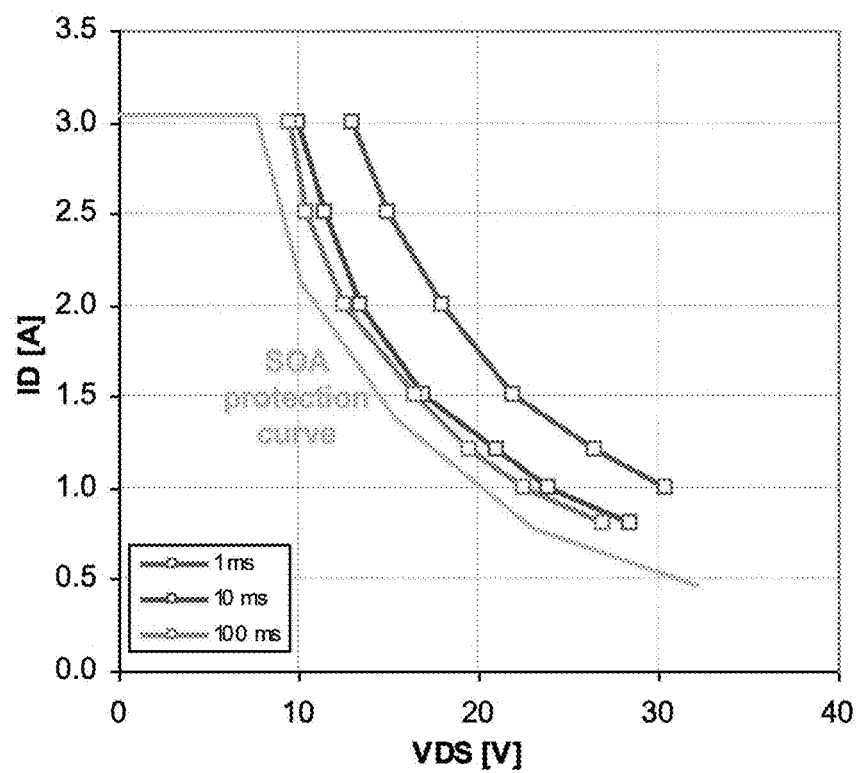
FIG. 1 is a graph showing a safe operating area (SOA) curve for a power transistor.
Figure 2:
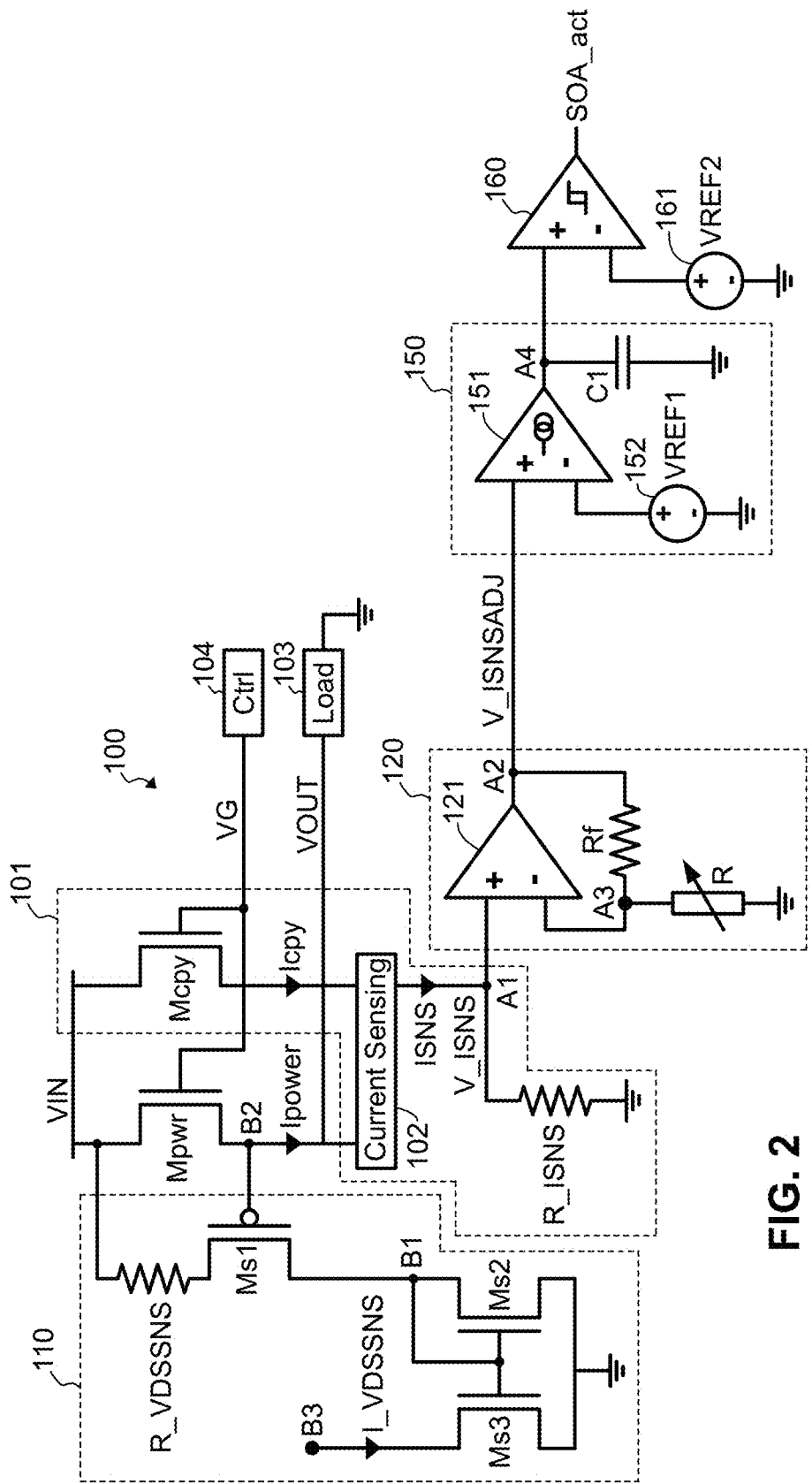
FIG. 2 is a schematic block diagram showing a power circuit disclosed herein including a SOA shaping circuit disclosed herein.

Now described with reference to FIG. 2 is a power circuit 100 disclosed herein which includes a protection mechanism. The power circuit 100 includes an n-channel power transistor Mpwr having a drain coupled to an input voltage VIN, a source connected to node B2, and a gate coupled to a gate drive voltage VG that is generated by a control circuit 104. An output voltage VOUT is produced at node B2. A load 103 is coupled between node B2 and ground.

The power circuit 100 includes a safe operating area (SOA) shaping circuit 120, which includes an amplifier 121 that receives a sense voltage V_ISNS produced at node A1, representative of the current Ipower flowing through the power transistor Mpwr, at its non-inverting input terminal. An adjustable resistance R is connected between node A3 and ground, and a resistor Rf is connected between nodes A2 and A3. The amplifier 121 outputs an adjusted voltage V_ISNSADJ at node A2 based on V_ISNS and the gain of the amplifier 121. The adjustable resistance R is a function of the drain to source voltage VDS of the power transistor Mpwr; the higher VDS is, the lower R is, and the lower VDS is, the higher R is. The gain of the amplifier 121 is defined by the resistances R and Rf, and can be mathematically represented as:

$$\frac{V\_ISNSADJ}{V\_ISNS} = \left(1 + \frac{R_F}{R}\right)$$

The power circuit 100 further includes a timing circuit 150 (e.g., an accumulation circuit) having an operational transconductance amplifier (OTA) 151 with its non-inverting input terminal connected to node A2 to receive the adjusted voltage V_ISNSADJ and its inverting input terminal coupled to receive a reference voltage VREF1 produced by a voltage generator 152. The output of the OTA 151 is connected to node A4, with capacitor C1 being connected between node A4 and ground. The OTA 151 sources current to, or sinks current from, capacitor C1 to thereby set the voltage across C1 as a function of the difference between the adjusted voltage V_ISNSADJ and the reference voltage VREF1. The voltage across capacitor C1 can be mathematically represented as:

$$V_{C1}(T) = \frac{gm_{151}}{C1} \int_0^T (V_{ISNSADJ} - VREF1)(t)dt$$

A comparator 160 has its non-inverting input terminal connected to node A4 and its inverting input terminal coupled to receive a reference voltage VREF2 produced by a voltage generator 161. The output of the comparator 160 asserts a trigger signal SOA_act to indicate that the power transistor Mpwr is operating outside of its safe operating area.

The purpose of the timing circuit 150 is to generate a timing function to prolong or reduce the response time of the protection mechanism depending on the overload condition (e.g., how much Ipower exceeds the desired level, as indicated by how much higher V_ISNSADJ is than VREF1).

Consider first the case where the adjusted voltage V_ISNSADJ is slightly higher than VREF1. In this case, the OTA 151 sources a small current to charge the capacitor C1. However, because the adjusted voltage V_ISNSADJ is slightly higher than VREF1 (e.g., because the current source to capacitor C1 is resultingly small), the time required to the charge capacitor C1 to the reference voltage VREF2 is relatively long. When the voltage across capacitor C1 rises and becomes equal to VREF2, the comparator 160 asserts the trigger signal SOA_act. In response to assertion of the trigger signal SOA_act, the control circuit 104 can reduce the gate voltage VG to ground or to a safe level, turning off or reduction conduction of the power transistor Mpwr.

Next, consider the case where the adjusted voltage V_ISNSADJ is significantly higher than VREF1. In this case, the OTA 151 sources a large current to charge the capacitor C1, and therefore the time required to the charge capacitor C1 to the reference voltage VREF2 is relatively short. When the voltage across capacitor C1 rises and becomes equal to VREF2, the comparator 160 asserts the trigger signal SOA_act.

Recall that the gain of the amplifier 121 is a function of the adjustable resistance R, which itself is a function of the drain to source voltage VDS of the power transistor Mpwr, with the gain decreasing as R increases. Recall that as VDS increases, the adjustable resistance R decreases. Therefore, consider the case where VDS is low. As a result, the adjustable resistance R is high, causing the gain of the amplifier 121 to approach unity. As a corollary of this, consider the case where VDS is high. As a result, the adjustable resistance R is low, setting a gain of the amplifier 121 to high. In this condition, for V_ISNSADJ to reach VREF1, only a small V_ISNS is required.

By adjusting the sense voltage V_ISNS to produce the adjusted voltage V_ISNSADJ, the SOA shaping circuit 120 allows the use of constant reference voltages VREF1 and VREF2 for determining whether the power transistor Mpwr is operating within its SOA. Indeed, by adjusting the sense voltage (V_ISNS) in line with the SOA curve while maintaining constant reference voltages VREF1 and VREF2, advantages over a design that would modify the reference voltages are provided.

For example, the consistency of signal levels in the timing circuit 150 improves its precision and functionality, as it therefore operates with the same signal level regardless of the position on the SOA curve. Thus, the timing provided by the timing circuit 150 do not depend on the currently position on the SOA curve, leading to more accurate and reliable protection.

Additionally, the design also provides enhanced flexibility by allowing for the adjustment of the protection curve, enabling usage of the SOA shaping circuit 120 with a variety of power transistors and not limiting the SOA shaping circuit 120 to use with one specific power transistor having particular characteristics. This may not be possible with a system that modifies the reference voltages.

Moreover, the use of low-voltage components in this design within circuits 110, 120, 150, 160 offers both practical and safety advantages. These components typically consume a smaller silicon area. The use of low-voltage components also inherently provides higher safety by reducing the risk of overvoltage damage or failures.

The sense voltage V_ISNS, representative of the current Ipower flowing through the power transistor Mpwr, is generated by a current sensing circuit 101. The current sensing circuit 101 includes a replica n-channel transistor Mcpy, which is a replica of the power transistor Mpwr (e.g., having a same length L as Mpwr, but having a width W that is substantially smaller than that of Mpwr). In greater detail, the replica transistor Mcpy has its drain coupled to receive the input voltage VIN, its source connected to current sensor 102, and its gate also coupled to the gate drive voltage VG. The current sensor 102 may be any circuit replicating the source voltage of Mpwr on the source of Mcpy, such as for example that shown in U.S. patent application Ser. No. 10/168,363, incorporated by reference herein.

The current sensor 102 is also connected to node B2. As a result of the operation of the current sensor 102, the replica transistor Mcpy sources a replica current Icpy which is a downscaled version (e.g., representative of, but lesser in magnitude) of the current Ipower. The current sensor 102 sources a sense current ISNS, representative of the current Ipower through the power transistor Mpwr, to node A1. The sense current ISNS can be mathematically represented as:

$$ISNS = \frac{Ipower}{k},$$

with k being the ratio in size between Mpwr and Mcpy, for example being between 100 and 10000.

A sense resistor R_ISNS is connected between node A1 and ground so that the sense voltage V_ISNS is produced at node A1, the sense voltage V_ISNS representative of the sense current ISNS. The sense voltage V_ISNS can be mathematically represented as:

$$V_{ISNS} = ISNS \cdot R_{ISNS} = \frac{Ipower}{k} \cdot R_{ISNS} = G \cdot Ipower$$

The VDS sensing circuit 110 includes a p-channel transistor Ms1 having its source coupled to the input voltage VIN through a resistor R_VDSSNS, its drain connected to node B1, and its gate connected to node B2. The drain to source voltage VDS of the power transistor Mpwr is applied across the series combination of the transistor Ms1 and resistor R_VDSSNS, which therefore form a transconductor and source a current to node B1 which is indicative of the drain to source voltage VDS of the transistor Mpwr.

An n-channel transistor Ms2 has its drain connected to node B1, its source connected to ground, and its gate connected to node B1. An n-channel transistor Ms3 has its drain connected to node B3, its source connected to ground, and its gate connected to node B1. Transistors Ms2 and Ms3 form a current mirror that sinks the current I_VDSSNS from B3 as a replica of the current sourced by transistor Ms1 to node B1.

Figure 3:
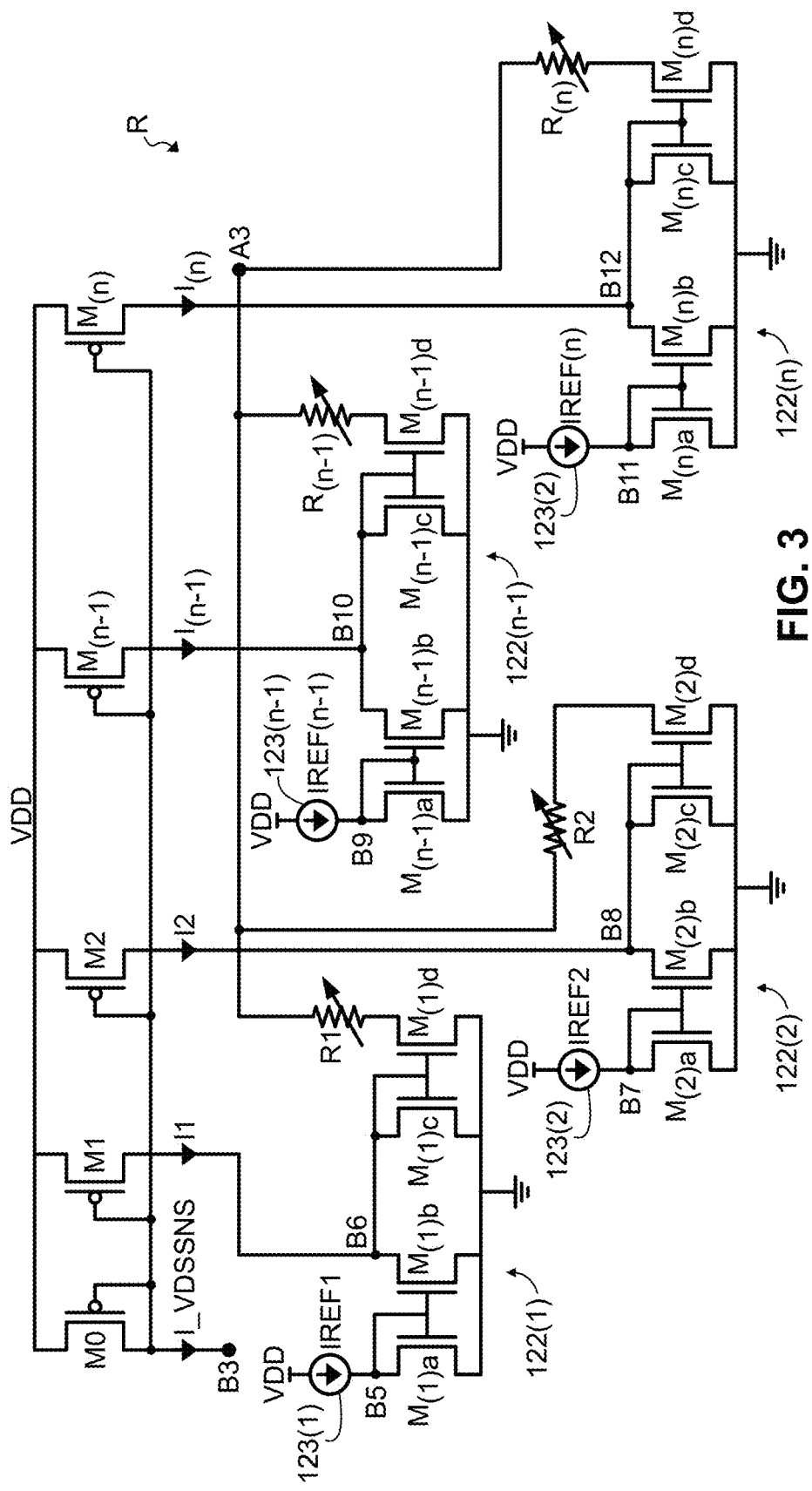
FIG. 3 is a schematic diagram showing a first circuit usable as the adjustable resistance of the power circuit of FIG. 2.

Referring additionally to FIG. 3, the adjustable resistance R is described, which functions to tune the value of R in a piecewise linear way.

The adjustable resistance R includes the following n+1 p-channel transistors: a p-channel transistor M0 having its source connected to the supply voltage VDD, its drain connected to node B3 (from which I_VDSSNS is sunk), and its gate connected to node B3; a p-channel transistor M1 having its source connected to the supply voltage VDD, its drain connected to node B6, and its gate connected to node B3; a p-channel transistor M2 having its source connected to the supply voltage VDD, its drain connected to node B8, and its gate connected to node B3; a p-channel transistor $M_{(n-1)}$ having its source connected to the supply voltage VDD, its drain connected to node B10, and its gate connected to node B3; and a p-channel transistor $M_{(n)}$ having its source connected to the supply voltage VDD, its drain connected to node B12, and its gate connected to node B3.

Each of the transistors M1, M2, $M_{(n-1)}$, . . . , $M_{(n)}$ are different in size, each represents a different number of equally sized transistors connected in parallel, or each represents a selectable number of equally sized transistors connected in parallel with different numbers having been selected. For example, in the case where the transistors are different in size, transistor M1 may be the largest, transistor M2 may be smaller than M1, transistor $M_{(n-1)}$ may be smaller than M2, and transistor $M_{(n)}$ may be smaller than $M_{(n-1)}$.

Observe that node B6 is part of trim circuit 122(1), node B8 is part of trim circuit 122(2), node B10 is part of trim circuit 122(n-1), and node B12 is part of trim circuit 122(n). Therefore, there may be any number n+1 of the p-channel transistors, with each p-channel transistor other than M0 having its drain connected to the respective node of a corresponding one of n trim circuits.

Trim circuit 122(1) includes a reference current generator 123(1) that sources a reference current IREF1 to node B5. An n-channel transistor $M_{(1)a}$ has its drain connected to node B5, its source connected to ground, and its gate connected to node B5. An n-channel transistor $M_{(1)b}$ has its drain connected to node B6, its source connected to ground, and its gate connected to node B5. An n-channel transistor $M_{(1)c}$ has its drain connected to node B6, its source connected to ground, and its gate connected to node B6. An n-channel transistor $M_{(1)d}$ has its drain connected to resistor R1, its source connected to ground, and its gate connected to node B6. The resistor R1 is connected between the drain of transistor $M_{(1)d}$ and node A3.

Trim circuit 122(2) includes a reference current generator 123(2) that sources a reference current IREF2 to node B7. An n-channel transistor $M_{(2)a}$ has its drain connected to node B7, its source connected to ground, and its gate connected to node B7. An n-channel transistor $M_{(2)b}$ has its drain connected to node B8, its source connected to ground, and its gate connected to node B7. An n-channel transistor $M_{(2)c}$ has its drain connected to node B8, its source connected to ground, and its gate connected to node B8. An n-channel transistor $M_{(2)d}$ has its drain connected to resistor R2, its source connected to ground, and its gate connected to node B8. The resistor R2 is connected between the drain of transistor $M_{(2)d}$ and node A3.

Trim circuit 122(n-1) includes a reference current generator 123(n-1) that sources a reference current IREF(n-1) to node B9. An n-channel transistor $M_{(n-1)a}$ has its drain connected to node B9, its source connected to ground, and its gate connected to node B9. An n-channel transistor $M_{(n-1)b}$ has its drain connected to node B10, its source connected to ground, and its gate connected to node B9. An n-channel transistor $M_{(n-1)c}$ has its drain connected to node B10, its source connected to ground, and its gate connected to node B10. An n-channel transistor $M_{(n-1)d}$ has its drain connected to resistor $R_{(n-1)}$, its source connected to ground, and its gate connected to node B10. The resistor $R_{(n-1)}$ is connected between the drain of transistor $M_{(n-1)d}$ and node A3.

Trim circuit 122(n) includes a reference current generator 123(n) that sources a reference current IREF(n) to node B11. An n-channel transistor M(n)a has its drain connected to node B11, its source connected to ground, and its gate connected to node B11. An n-channel transistor $M_{(n)b}$ has its drain connected to node B12, its source connected to ground, and its gate connected to node B11. An n-channel transistor $M_{(n)c}$ has its drain connected to node B12, its source connected to ground, and its gate connected to node B12. An n-channel transistor $M_{(n)d}$ has its drain connected to resistor $R_{(n)}$, its source connected to ground, and its gate connected to node B12. The resistor $R_{(n)}$ is connected between the drain of transistor $M_{(n)d}$ and node A3.

In the above trim circuits 122(1), 122(2), . . . , 122(n-1), 122(n), the reference currents IREF1, IREF2, IREF(n-1), and IREF(n) may be equal in magnitude.

Recall that the transistors M1, M2, . . . , $M_{(n-1)}$, $M_{(n)}$ are different in size. Therefore, while each of these transistors mirrors I_VDSSNS to its drain, the resulting mirrored currents are scaled differently. For example, transistor M1 mirrors I_VDSSNS to its drain as current I1, transistor M2 mirrors I_VDSSNS to its drain as current I2, transistor $M_{(n-1)}$ mirrors I_VDSSNS to its drain as current $I_{(n-1)}$, and transistor M(n) mirrors I_VDSSNS to its drain as current $I_{(n)}$, with I1 being greater than I2, I2 being greater than $I_{(n-1)}$, and $I_{(n-1)}$ being greater than $I_{(n)}$.

Trim circuit 122(1) compares (e.g., sums) the current I1, mirrored by the arrangement of transistors M0, M1 to node B6, to the current IREF1, mirrored by the arrangement of transistors $M_{(1)a}$, $M_{(1)b}$ to node B6. Note that due to the arrangement of transistors M0, M1, the current I1 is a scaled version of I_VDSSNS. As the current I1 becomes increasingly lower than current IREF1, the drain of transistor $M_{(1)b}$ connected to node B6 becomes increasingly close to ground, driving the gates of transistors $M_{(1)c}$ and $M_{(1)d}$ increasingly close to ground; as the gates of $M_{(1)c}$ and $M_{(1)d}$ approach ground, transistor $M_{(1)d}$ in turn approaches a high impedance state in which resistor R1 will be practically floating. Conversely, as the current I1 becomes increasingly higher than current IREF1, the drain of transistor $M_{(1)b}$ connected to node B6 rises increasingly above ground, driving the gates of transistors $M_{(1)c}$ and $M_{(1)d}$ increasingly above ground; the conductivity of the transistors $M_{(1)c}$ and $M_{(1)d}$ will then depend upon how high the gates thereof are driven above ground.

Trim circuit 122(2) compares the current I2, mirrored by the arrangement of transistors M0, M2 to node B8, to the current IREF2, mirrored by the arrangement of transistors $M_{(2)a}$, $M_{(2)b}$ to node B8. The current I2 is a scaled version of I_VDSSNS. As the current I2 becomes increasingly lower than current IREF2, the drain of transistor $M_{(2)b}$ connected to node B8 becomes increasingly close to ground, driving the gates of transistors $M_{(2)c}$ and $M_{(2)d}$ increasingly close to ground; as the gates of $M_{(2)c}$ and $M_{(2)d}$ approach ground, transistor $M_{(2)d}$ in turn approaches a high impedance state in which resistor R2 will be practically floating. Conversely, as the current I2 becomes increasingly higher than current IREF2, the drain of transistor $M_{(2)b}$ connected to node B8 rises increasingly above ground, driving the gates of transistors $M_{(2)c}$ and $M_{(2)d}$ increasingly above ground; the conductivity of the transistors $M_{(2)c}$ and $M_{(2)d}$ will then depend upon how high the gates thereof are driven above ground. Since the current I1 will be greater than the current I2, if I1 is less than IREF1, I2 will be less than IREF2.

Trim circuit 122(n−1) compares the current $I_{(n-1)}$, mirrored by the arrangement of transistors M0, $M_{(n-1)}$ to node B10, to the current IREF(n−1), mirrored by the arrangement of transistors $M_{(n-1)a}$, $M_{(n-1)b}$ to node B10. The current I(n−1) is a scaled version of I_VDSSNS. As the current $I_{(n-1)}$ becomes increasingly lower than current IREF(n−1), the drain of transistor $M_{(n-1)b}$ connected to node B10 becomes increasingly close to ground, driving the gates of transistors $M_{(n-1)c}$ and $M_{(n-1)d}$ increasingly close to ground; as the gates of $M_{(n-1)c}$ and $M_{(n-1)d}$ approach ground, transistor $M_{(n-1)d}$ in turn approaches a high impedance state in which resistor $R_{(n-1)}$ will be practically floating. Conversely, as the current $I_{(n-1)}$ becomes increasingly higher than current IREF(n−1), the drain of transistor $M_{(n-1)b}$ connected to node B10 rises increasingly above ground, driving the gates of transistors $M_{(n-1)c}$ and $M_{(n-1)d}$ increasingly above ground; the conductivity of the transistors $M_{(n-1)c}$ and $M_{(n-1)d}$ will then depend upon how high the gates thereof are driven above ground. Since the current I2 will be greater than the current $I_{(n-1)}$, if I2 is less than IREF2, $I_{(n-1)}$ will be less than IREF(n−1).

Trim circuit 122(n) compares the current I(n), mirrored by the arrangement of transistors M0, $M_{(n)}$ to node B12, to the current IREF(n), mirrored by the arrangement of transistors $M_{(n)a}$, $M_{(n)b}$ to node B12. The current $I_{(n)}$ is a scaled version of I_VDSSNS. As the current $I_{(n)}$ becomes increasingly lower than current IREF(n), the drain of transistor $M_{(n)b}$ connected to node B12 becomes increasingly close to ground, driving the gates of transistors $M_{(n)c}$ and $M_{(n)d}$ increasingly close to ground; as the gates of $M_{(n)c}$ and $M_{(n)d}$ approach ground, transistor $M_{(n)d}$ in turn approaches a high impedance state in which resistor $R_{(n)}$ will be practically floating. Conversely, as the current $I_{(n)}$ becomes increasingly higher than current IREF(n), the drain of transistor $M_{(n)b}$ connected to node B12 rises increasingly above ground, driving the gates of transistors $M_{(n)c}$ and $M_{(n)d}$ increasingly above ground; the conductivity of the transistors $M_{(n)c}$ and $M_{(n)d}$ will then depend upon how high the gates thereof are driven above ground. Since the current $I_{(n-1)}$ will be greater than the current $I_{(n)}$, if $I_{(n-1)}$ is less than IREF(n−1), $I_{(n)}$ will be less than IREF(n).

In summary therefore, the higher the drain to source voltage VDS of the power transistor Mpwr, the higher the current I_VDSSNS, the more fully the resistors R1, R2, ..., $R_{(n-1)}$, $R_{(n)}$ are connected between node A3 and ground by the trim circuits 122(1), 122(2), ..., $122_{(n-1)}$, $122_{(n)}$, the lower the overall resistance R, and higher the gain of the amplifier 121.

Conversely, the lower the drain to source voltage VDS of the power transistor Mpwr, the lower the current I_VDSSNS, and the less fully the resistors R1, R2, ..., $R_{(n-1)}$, $R_{(n)}$ are connected between node A3 and ground by the trim circuits 122(1), 122(2), ..., $122_{(n-1)}$, $122_{(n)}$, the higher the overall resistance R, and lower the gain of the amplifier 121.

Keeping this in mind, the gain of the amplifier 121 can be mathematically represented as:

$$\frac{V\_ISNSADJ}{V\_ISNS} = \left(1 + \frac{R_F}{\frac{R1}{a1}\left\|\frac{R2}{a2}\right\| \ldots \left\|\frac{R_{n-1}}{a_{n-1}}\right\|\frac{R_n}{a_n}}\right)$$

in this $a_i \in \langle 0,1 \rangle$, with $a_i = f(VDS)$

To explain, the gain of the amplifier 121 is a function of the ratio of Rf to the parallel combination of the resistors R1, R2, ..., $R_{(n-1)}$, $R_{(n)}$, with the resistance of each resistor being divided by a respective constant a1, a2, ..., $a_{(n-1)}$, $a_{(n)}$ that has a value between 0 and 1 that is a function of the drain to source voltage VDS of the power transistor Mpwr. Regarding these constants, a1 is greater than a2, a2 is greater than $a_{(n-1)}$, and $a_{(n-1)}$ is greater than $a_{(n)}$. Therefore, the greater VDS is, the closer each constant a1, a2, ..., $a_{(n-1)}$, $a_{(n)}$ is to 1.

The above design for the adjustable resistance R described with reference to FIG. 2 utilizes the progressive turn-on of the transistors M(1)c, M(1)d, M(n−1)c, M(n−1)d, M(n)c, and M(n)d as a function of the comparison between currents IREF1, IREF2, IREF(n−1), IREF(n) and I1, I2, $I_{(n-1)}$, I(n). However, also disclosed is a design in which the turn-on of the transistors M(1)c, M(1)d, M(n−1)c, M(n−1)d, M(n)c, and M(n)d occurs quickly and can effectively thought of as digital in nature.

Figure 4:
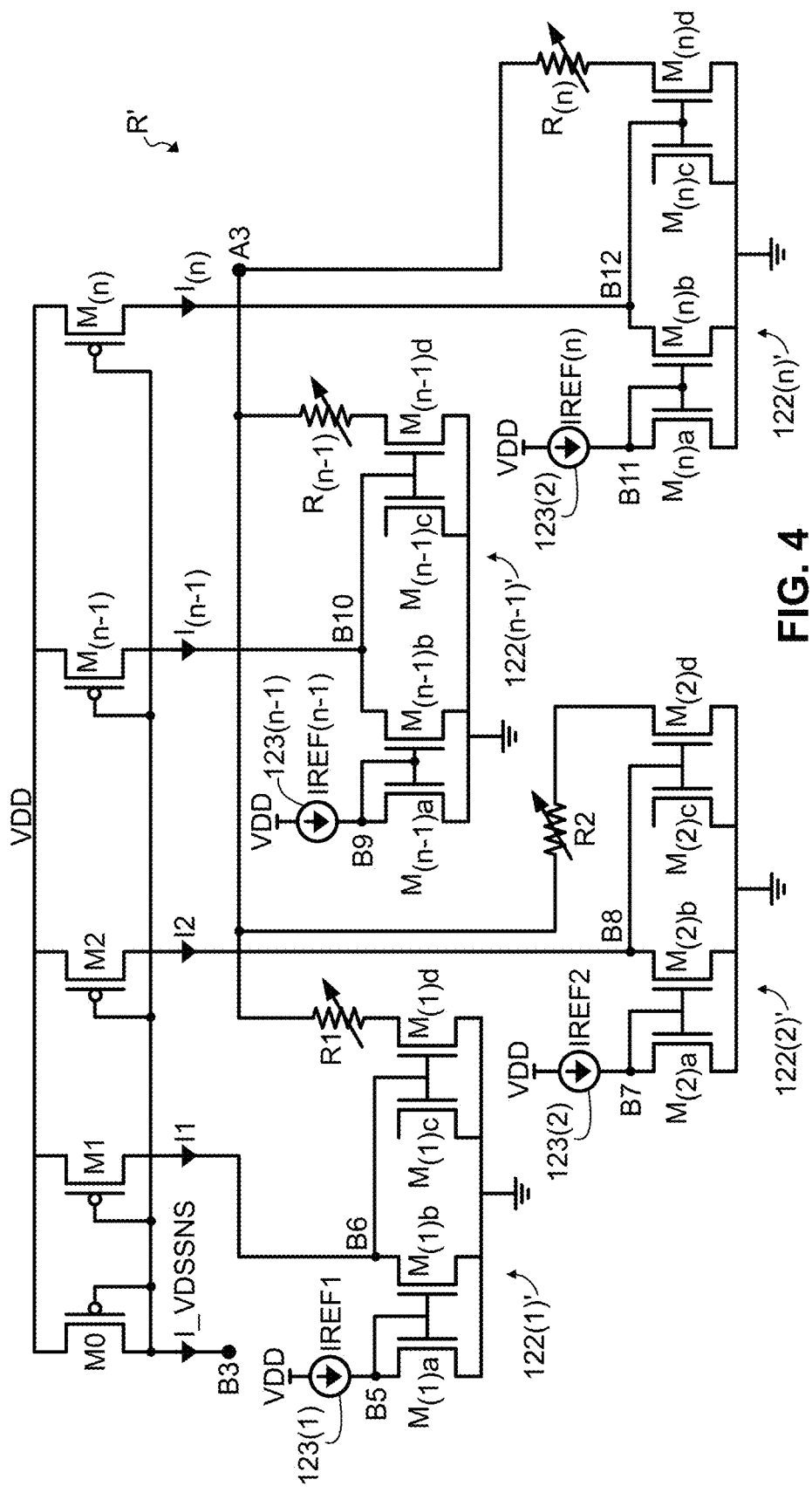
FIG. 4 is a schematic diagram showing a second circuit usable as the adjustable resistance of the power circuit of FIG. 2.

This design for the adjustable resistance R' is shown in FIG. 4. In terms of the circuit layout, the adjustable resistance R' is the same as the adjustable resistance R described above, with the exception being that the drains of the transistors M(1)c, M(1)d, M(n−1)c, M(n−1)d, M(n)c, and M(n)d are not connected to nodes B6, B8, B10, and B12 but are instead left floating; as an alternative, the transistors M(1)c, M(1)d, M(n−1)c, M(n−1)d, M(n)c, and M(n)d are not present. Operation of this embodiment is now described.

Trim circuit 122(1)' compares the current I1, mirrored by the arrangement of transistors M0, M1 to node B6, to the current IREF1, mirrored by the arrangement of transistors $M_{(1)a}$, $M_{(1)b}$ to node B6. Note that due to the arrangement of transistors M0, M1, the current I1 is a scaled version of I_VDSSNS. If the current IREF1, mirrored to node B6, is higher than the current I1, the drain of transistor $M_{(1)b}$ connected to node B6 will be close to ground, driving the gates of transistors $M_{(1)c}$ and $M_{(1)d}$ close to ground; transistor $M_{(1)d}$ will then be in a high impedance state and resistor R1 will be practically floating. If the current IREF1, mirrored to node B6, is lower than the current I1, the drain of transistor $M_{(1)b}$ connected to node B6 will be above ground, driving the gates of transistors $M_{(1)c}$ and $M_{(1)d}$ above ground; the conductivity of the transistors $M_{(1)c}$ and $M_{(1)d}$ will depend upon how high the gates thereof are driven above ground.

Trim circuit 122(2)' compares the current I2, mirrored by the arrangement of transistors M0, M2 to node B8, to the current IREF2, mirrored by the arrangement of transistors $M_{(2)a}$, $M_{(2)b}$ to node B8. The current I2 is a scaled version of I_VDSSNS. If the current IREF2, mirrored to node B8, is higher than the current I2, the drain of transistor $M_{(2)b}$ connected to node B8 will be close to ground, driving the gates of transistors $M_{(2)c}$ and $M_{(2)d}$ close to ground; transistor $M_{(2)d}$ will then be in a high impedance state and resistor R2 will be practically floating. If the current IREF2, mirrored to node B8, is lower than the current I2, the drain of transistor $M_{(2)b}$ connected to node B8 will be above ground, driving the gates of transistors $M_{(2)c}$ and $M_{(2)d}$ above ground; the conductivity of the transistors $M_{(2)c}$ and $M_{(2)d}$ will depend upon how high the gates thereof are driven above ground. Since the current I1 will be greater than the current I2, if I1 is less than IREF1, I2 will be less than IREF2.

Trim circuit 122(n−1)' compares the current $I_{(n-1)}$, mirrored by the arrangement of transistors M0, $M_{(n-1)}$ to node B10, to the current IREF(n−1), mirrored by the arrangement of transistors $M_{(n-1)}a$, $M_{(n-1)b}$ to node B10. The current $I_{(n-1)}$ is a scaled version of I_VDSSNS. If the current IREF(n−1), mirrored to node B10, is higher than the current $I_{(n-1)}$, the drain of transistor $M_{(n-1)b}$ connected to node B10 will be close to ground, driving the gates of transistors $M_{(n-1)c}$ and $M_{(n-1)d}$ close to ground; transistor $M_{(n-1)d}$ will then be in a high impedance state and resistor $R_{(n-1)}$ will be practically floating. If the current IREF(n−1), mirrored to node B10, is lower than the current $I_{(n-1)}$, the drain of transistor $M_{(n-1)b}$ connected to node B10 will be above ground, driving the gates of transistors M(n-1)c and $M_{(n-1)d}$ above ground; the conductivity of the transistors $M_{(n-1)c}$ and $M_{(n-1)d}$ will depend upon how high the gates thereof are driven above ground. Since the current I2 will be greater than the current $I_{(n-1)}$, if I2 is less than IREF2, $I_{(n-1)}$ will be less than IREF(n−1).

Trim circuit 122(n)' compares the current $I_{(n)}$, mirrored by the arrangement of transistors M0, $M_{(n)}$ to node B12, to the current IREF(n), mirrored by the arrangement of transistors $M_{(n)a}$, $M_{(n)b}$ to node B12. The current I(n) is a scaled version of I_VDSSNS. If the current IREF(n), mirrored to node B12, is higher than the current $I_{(n)}$, the drain of transistor $M_{(n)b}$ connected to node B12 will be close to ground, driving the gates of transistors $M_{(n)c}$ and $M_{(n)d}$ close to ground; transistor $M_{(n)d}$ will then be in a high impedance state and resistor $R_{(n)}$ will be practically floating. If the current IREF(n), mirrored to node B12, is lower than the current $I_{(n)}$, the drain of transistor $M_{(n)b}$ connected to node B12 will be above ground, driving the gates of transistors $M_{(n)c}$ and $M_{(n)d}$ above ground; the conductivity of the transistors $M_{(n)c}$ and $M_{(n)d}$ will depend upon how high the gates thereof are driven above ground. Since the current $I_{(n-1)}$ will be greater than the current $I_{(n)}$, if $I_{(n-1)}$ is less than IREF(n−1), $I_{(n)}$ will be less than IREF(n).

In summary therefore, the higher the drain to source voltage VDS of the power transistor Mpwr, the higher the current I_VDSSNS, and the larger the number of the trim circuits 122(1)', 122(2)', . . . , $122_{(n-1)'}$, $122_{(n)'}$ that will connect their respective resistors R1, R2, . . . , $R_{(n-1)}$, $R_{(n)}$ between node A3 and ground. The larger the number of the resistors R1, R2, . . . , $R_{(n-1)}$, $R_{(n)}$ connected between node A3 and ground, the lower the overall resistance R, and higher the gain of the amplifier 121.

Conversely, the lower the drain to source voltage VDS of the power transistor Mpwr, the lower the current I_VDSSNS, and the lower the number of the trim circuits 122(1)', 122(2)', . . . , $122_{(n-1)'}$, $122_{(n)'}$ that will connect their respective resistors R1, R2, . . . , $R_{(n-1)}$, $R_{(n)}$ between node A3 and ground. The lower the number of the resistors R1, R2, . . . , $R_{(n-1)}$, $R_{(n)}$ connected between node A3 and ground, the higher the overall resistance R, and lower the gain of the amplifier 121.

Keeping this in mind, the gain of the amplifier 121 can be mathematically represented as:

$$\frac{V\_ISNSADJ}{V\_ISNS} = \left(1 + \frac{R_F}{\frac{R1}{a1} \left\| \frac{R2}{a2} \right\| \ldots \left\| \frac{R_{n-1}}{a_{n-1}} \right\| \frac{R_n}{a_n}}\right)$$

in this $a_i \in \{0; 1\}$

Figure 5:
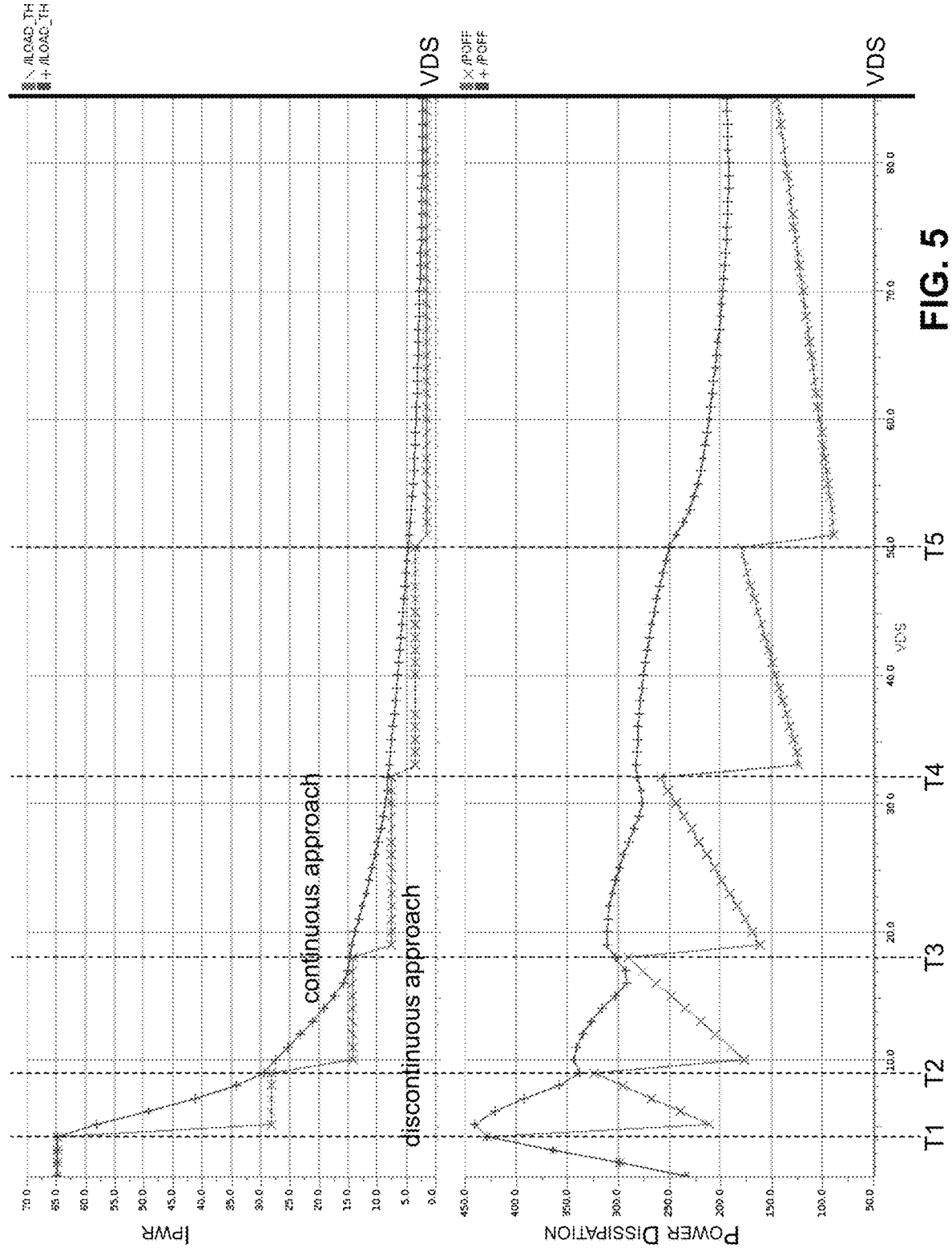
FIG. 5 includes graphs of power transistor current vs power transistor drain to source voltage, as well as power dissipation vs power transistor drain to source voltage, resulting from the operation of the power circuit of FIG. 2 with both the circuit of FIG. 3 serving as the adjustable resistance R as well as the circuit of FIG. 4 serving as the adjustable resistance R.
Figure 6:
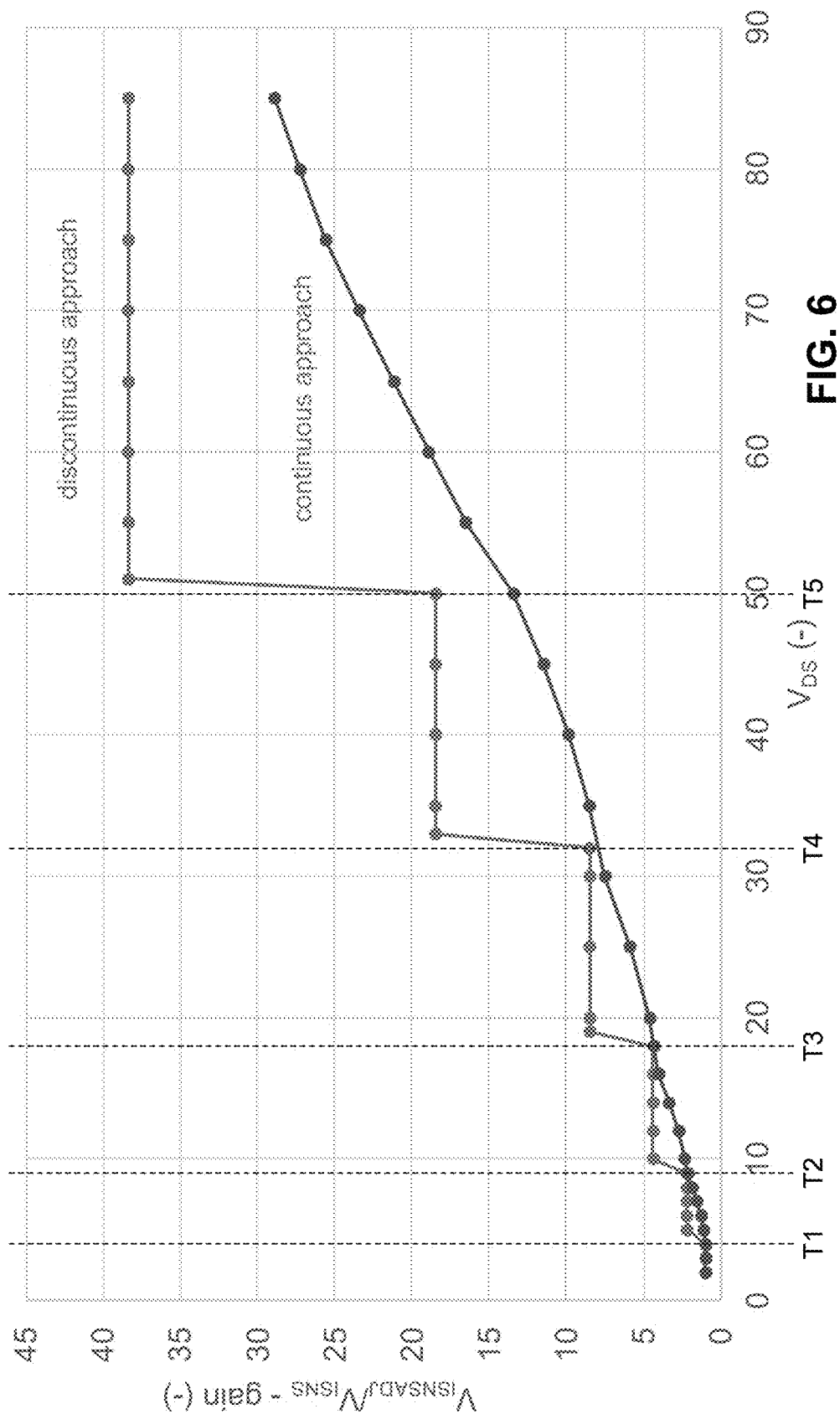
FIG. 6 is a graph showing the gain of the amplifier of the power circuit of FIG. 2 resulting from the operation of the power circuit of FIG. 2 with both the circuit of FIG. 3 serving as the adjustable resistance R as well as the circuit of FIG. 4 serving as the adjustable resistance R.

The results of the difference between controlling the adjustable resistance R in the continuous manner of FIG. 3 and the discontinuous manner of FIG. 4 may be seen in FIGS. 5-6. For example, in FIG. 5, in the top graph, the current Ipwr through the power transistor Mpwr vs the drain to source voltage VDS of Mpwr for the approaches of FIGS. 3-4 can be observed.

Observe that prior to time T1, using both the continuous and discontinuous approach, the current Ipwr is constant.

Describing the discontinuous approach of FIG. 4 now, at time T2, VDS has risen sufficiently for the trim circuit 122(1)' to connect resistor R1 between node A3 and ground, and the current Ipwr is reduced and then becomes a constant current over a given range of VDS. At time T3, VDS has risen sufficiently for the trim circuit 122(2)' to connect the resistor R2 between node A3 and ground, and the current Ipwer is again reduced and becomes a constant current for a given range of VDS. Similarly, at time T4, VDS has risen sufficiently for the trim circuit 122(n−1)' to connect the resistor $R_{(n-1)}$ between node A3 and ground, and the current Ipower is reduced accordingly and becomes a constant current for a given range of VDS. Finally, at time T5, VDS has risen sufficiently for the trim circuit 122(n)' to connect the resistor $R_{(n)}$ between node A3 and ground, and the current Ipower is reduced accordingly and becomes a constant current for a given range of VDS.

Compare the above to the continuous approach of FIG. 3. As can be observed in this top graph of FIG. 5, rather than the sharp drops in current Ipower caused by the abrupt changes in the resistance R, the change in current Ipower as the drain to source voltage VDS increases is smooth.

The effect of both the discontinuous approach and continuous approach of the control of the adjustable resistance R is similar and equally visible in the lower graph of power dissipation vs the voltage VDS.

Similarly, the effect of both the discontinuous approach and continuous approach of the control of the adjustable resistance R is similar and equally visible in the graph of the gain of the comparator 121 of FIG. 6.

Figure 7:
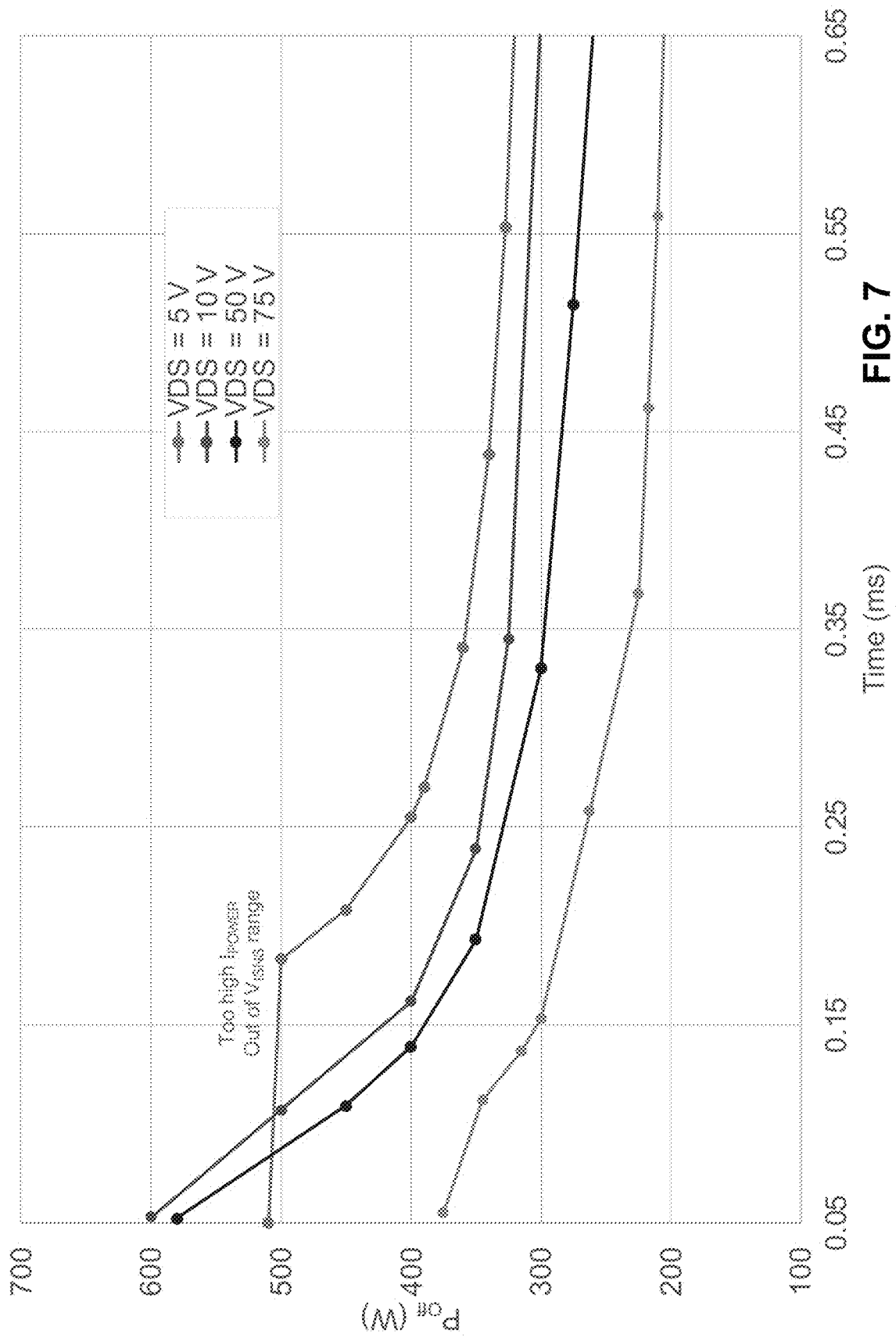
FIG. 7 is a graph showing the different times for the timing circuit to trigger the comparator of the power circuit of FIG. 2 given different power dissipations as well as different drain to source voltages of the power transistor.

The time to trigger the comparator 151 of the timing circuit 150 for different overload values and drain to source voltage VDS of the power transistor Mpwr may be observed in FIG. 7.

Figure 8:
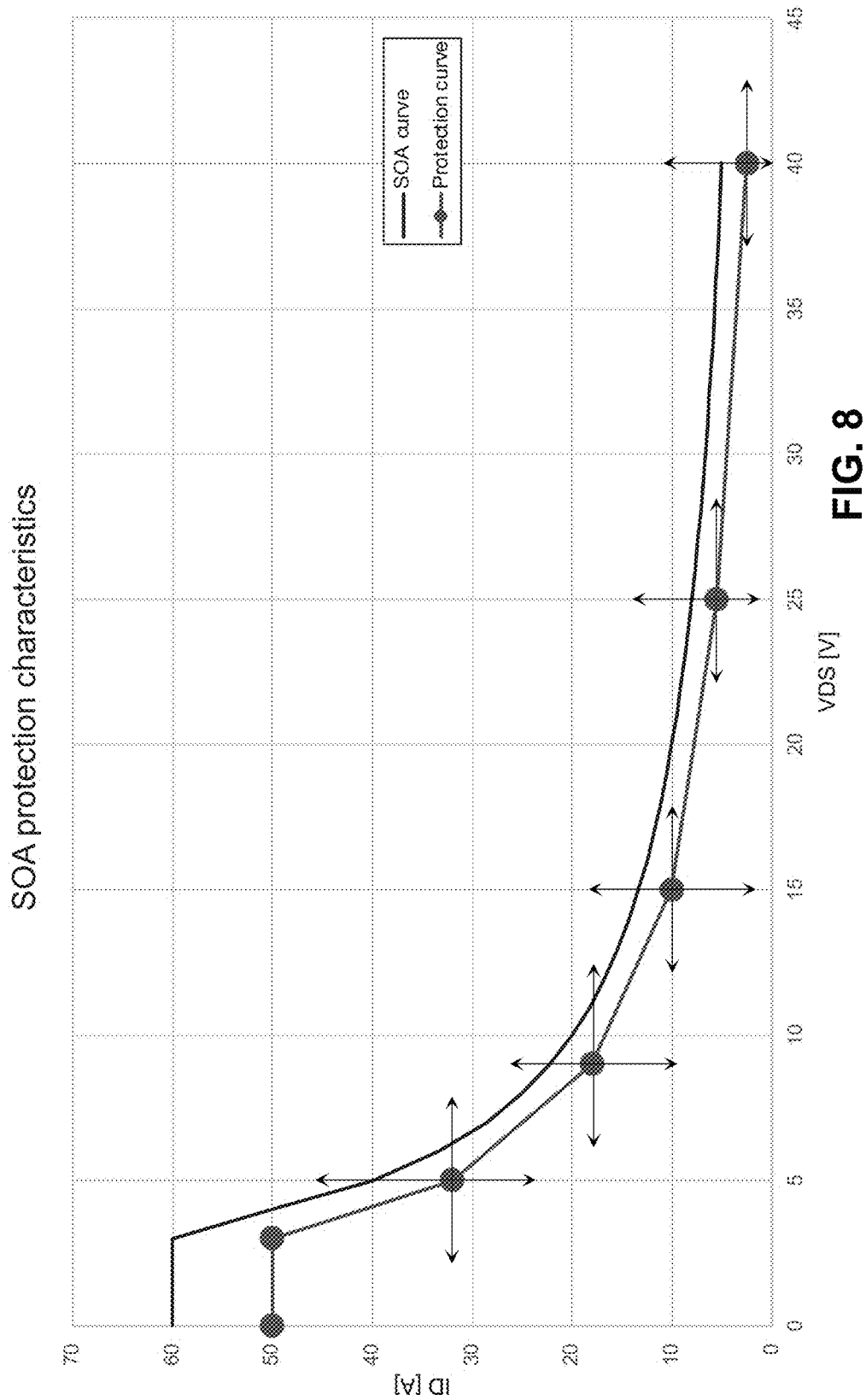
FIG. 8 is a graph showing the adjustability of the power circuit to accommodate a desired SOA for the power transistor.

The power circuit 100 provides for a high degree of adjustability in terms of the SOA curve. Resistors R1, R2, . . . , $R_{(n1)}$, $R_{(n)}$, in both FIGS. 3-4, may be trimmable, with this trimming being usable to tune the SOA curve. Also, in the case where the transistors M1, M2, M(n−1), and M(n) each represent multiple parallel connected transistors, the number of those transistors activated for each may be adjusted. The process of tuning the SOA curve involves adjusting the resistances of R1, R2, . . . , $R_{(n-1)}$, $R_{(n)}$, and (optionally) adjusting the number of parallel connected transistors represented by each of M1, M2, M(n−1), and M(n), to shift the SOA curve to a desired range. This adjustability is well shown in the illustrated protection curve of FIG. 8.

This is particularly useful for matching the SOA shaping circuit 120 to the specific power transistor Mpwr used, for example with the power transistor Mpwr being part of an electronic fuse. This is because the power transistor Mpwr and its replica counterpart Icpy may reside on a separate chip than the rest of the components 101, 110, 120, 150, and 160. The SOA shaping circuit 120 therefore allows for the creation of a modular design. This is particularly useful in scenarios where different power transistor characteristics or performance levels are desired for different applications or use-cases. As a result, the control module chip can be standardized and mass-produced, leading to cost and time efficiencies in manufacturing, while still retaining the flexibility to meet the needs of various power transistor specifications.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A power circuit, comprising:
a power transistor coupled between an input node and an output node, the power transistor receiving a control signal from a controller;
a current sensing circuit configured to sense a power current provided by the power transistor to the output node and generate a sense voltage based thereupon;
a voltage sensing circuit configured to sense a drain to source voltage of the power transistor and generate a VDS sense current based thereupon;
a safe operating area (SOA) shaping circuit having a gain set by an adjustable resistance, the adjustable resistance being dynamically adjusted based upon the VDS sense current, the SOA shaping circuit configured to apply the gain to the sense voltage to produce an adjusted sense voltage;
a timing circuit configured to generate an intermediate voltage based upon a comparison between the adjusted sense voltage and a first reference; and
an output comparator configured to assert a flag in response to the intermediate voltage becoming at least equal to a second reference;
wherein the controller is configured to modify the control signal in response to assertion of the flag.

2. The power circuit of claim 1, wherein the current sensing circuit includes:
a replica transistor coupled between the input node and the output node, the replica transistor receiving the control signal from the controller;
wherein the replica transistor has a same width to length ratio as the power transistor but is smaller in size, thereby generating a replica current that is representative of, but lesser in magnitude than, the power current; and
a sensor configured to generate a sense current based upon the replica current, with the sense voltage being generated based upon the sense current flowing through a sense resistor.

3. The power circuit of claim 1, wherein the voltage sensing circuit comprises:
a first sense transistor having a first conduction terminal coupled to the input node through a VDS sense resistor, a second conduction terminal coupled to a first node, and a control terminal coupled to the output node; and
a current mirror having an input connected to the first node and an output connected to a second node.

4. The power circuit of claim 1, wherein the SOA shaping circuit comprises:
an amplifier having a non-inverting input coupled to receive the sense voltage and an inverting input coupled to an output of the amplifier through a feedback resistor; and
the adjustable resistance coupled between the inverting input of the amplifier and ground.

5. The power circuit of claim 1, wherein the adjustable resistance is coupled to an input node of the SOA shaping circuit; and
wherein the adjustable resistance comprises:
a mirroring circuit configured to mirror the VDS sense current to thereby generate a plurality of differently scaled mirrored currents;
a plurality of current comparators each configured to compare a respective one of the plurality of different scaled mirrored currents to a corresponding one of a plurality of reference currents and to produce a comparison voltage at a respective comparison node based thereupon; and
a plurality of resistors each coupled between a corresponding one of the comparison nodes and the input node of the SOA shaping circuit.

6. The power circuit of claim 5, wherein each of the plurality of current comparators comprises:
a current mirror having an input coupled to receive the corresponding one of the plurality of reference currents and an output coupled to the respective comparison node; and
a transistor arrangement coupled to a corresponding one of the plurality of resistors, control of the transistor arrangement being based upon the comparison voltage at the respective comparison node.

7. The power circuit of claim 6, wherein the transistor arrangement comprises:
a current mirror having an input coupled to the respective comparison node and an output coupled to the corresponding one of the resistors.

8. The power circuit of claim 6, wherein the transistor arrangement comprises:
an output transistor having a first conduction terminal coupled to the corresponding one of the resistors, a second conduction terminal coupled to ground, and a control terminal coupled to receive the comparison voltage.

9. The power circuit of claim 8, wherein the transistor arrangement further comprises:
an additional transistor having a first conduction terminal left floating, a second conduction terminal coupled to ground, and a control terminal coupled to receive the comparison voltage.

10. The power circuit of claim 1, wherein the first and second references are equal.

11. A method of protecting a power transistor, the method comprising:
continuously sensing a drain to source voltage of the power transistor;
sensing a current flowing through the power transistor;
generating an adjusted voltage from the sensed current based on the continuously sensed drain to source voltage;
comparing the adjusted voltage with a first reference voltage to produce a comparison value;
accumulating the comparison value over time to produce an accumulated voltage;

comparing the accumulated voltage with a second reference voltage; and triggering a protection mechanism when the accumulated voltage reaches the second reference voltage.

12. The method of claim 11, wherein the generating of the adjusted voltage includes amplifying the sensed current by a gain determined based upon an adjustable resistance, wherein the adjustable resistance is adjusted based on the continuously sensed drain to source voltage.

13. The method of claim 12, wherein the adjustable resistance is continuously adjusted based on the continuously sensed drain to source voltage.

14. The method of claim 12, wherein the adjustable resistance is adjusted in a piecewise fashion based on the continuously sensed drain to source voltage.

15. The method of claim 11, wherein sensing the current flowing through the power transistor comprises: generating a scaled replica of the current flowing through the power transistor using a replica transistor that is a scaled replica of the power transistor, and generating the sensed current from the scaled replica of the current flowing through the power transistor.

16. The method of claim 15, wherein sensing the current flowing through the power transistor further comprises generating a sense voltage from the sensed current; and wherein generating the adjusted voltage comprises adjusting the sense voltage to produce the adjusted voltage.

\* \* \* \* \*